United States Patent [19]
Wong

[11] Patent Number: 5,255,240
[45] Date of Patent: Oct. 19, 1993

[54] ONE STAGE WORD LINE DECODER/DRIVER WITH SPEED-UP DARLINGTON DRIVE AND ADJUSTABLE PULL DOWN

[75] Inventor: Robert C. Wong, Poughkeepsie, N.Y.

[73] Assignee: International Business Machines Corporation, Armonk, N.Y.

[21] Appl. No.: 714,442

[22] Filed: Jun. 13, 1991

[51] Int. Cl.$^5$ .......................... G11C 8/00; H03K 3/26
[52] U.S. Cl. .................. 365/230.06; 365/189.06; 307/270; 307/315
[58] Field of Search ............. 365/230.06, 189, 189.06, 365/174; 307/270, 315, 443

[56] References Cited

U.S. PATENT DOCUMENTS

| | | | |
|---|---|---|---|
| 3,727,188 | 4/1973 | Horsten | 307/268 |
| 4,002,931 | 1/1977 | Tsang et al. | 307/264 |
| 4,131,808 | 12/1978 | Kuo | 307/270 |
| 4,191,899 | 3/1980 | Tomezak et al. | 307/270 |
| 4,210,826 | 7/1980 | Baker | 307/270 |
| 4,236,089 | 11/1980 | Baker | 307/254 |
| 4,357,687 | 11/1982 | Rufford | 365/230.06 |
| 4,376,252 | 3/1983 | Masenas, Jr. | 307/482 |
| 4,520,462 | 5/1985 | Yamada et al. | 365/230.06 |
| 4,706,222 | 11/1987 | Kwiatkowski et al. | 365/230 |
| 4,725,741 | 2/1988 | Shekhawat et al. | 307/270 |
| 4,760,282 | 7/1988 | Kuo et al. | 307/270 |
| 4,794,280 | 12/1988 | Van Tran | 307/446 |
| 4,806,785 | 2/1989 | Michail et al. | 307/254 |
| 5,027,013 | 6/1991 | Coy et al. | 307/455 |

*Primary Examiner*—Timothy P. Callahan
*Attorney, Agent, or Firm*—Whitham & Marhoefer

[57] ABSTRACT

A word line decoder/driver has a Darlington circuit connected in parallel with word line driver transistors to provide rapid switching thereof. The Darlington circuit receives an input from decoder transistors through a capacitance, such as a diffusion capacitance, which establishes a time constant longer than the nominal access cycle time of the memory. Thus, during the nominal cycle time of the memory, the word line driver transistors merely supplement the pull-up of the word lines, the speed of which is limited only by the switching speed of the Darlington circuit. Therefore, the pull-up of the input to the word line driver transistors is made non-critical and the circuit can be simplified to reduce element count while achieving substantial reduction in power consumption. While the fast collector pull down of the deselected word line is controlled by an adjustable clamp, word line pull-up is maintained well below 1 nsec and chip access time is below 2 nsec and voltage margins are increased. By converting input voltage levels to lower values with respect to the power supply voltage, large voltage swings can be achieved with a single stage circuit within a 3.6 volt power supply.

12 Claims, 5 Drawing Sheets

ONE STAGE WORD LINE DECODER/DRIVER WITH SPEED-UP DARLINGTON DRIVE AND ADJUSTABLE PULL DOWN

BACKGROUND OF THE INVENTION

1. Field of the Invention

The present invention generally relates to decoder/driver circuits for static memories and, more particularly, to word line decoder/driver circuits capable of extremely fast operation and wide word line voltage swings.

2. Description of the Prior Art

Electronic memory circuits have been known for many years. Such memory circuits have employed a wide variety of types of circuits and circuit elements in order to store information in some way, such as by storage of charge in a capacitive element or the use of a bistable circuit or element. Such a bistable element can take the form, for example, of the well-known flip-flop circuit, where a pair of transistors are cross-coupled in such a way that when one transistor is turned on, the other will be forced off, or a magnetizable core or other element or domain which can be selectively magnetized into one of at least two distinct states.

Each of these memory types, categorized by the type of memory cell employed, has distinct advantages and disadvantages with respect to the other types of memory and each type will typically be applied where the advantages can be best utilized. In particular, static random access memories using bistable circuits constructed from bipolar transistors are typically used in cache memories and central processing units due to their characteristically high speed. The access cycle times of such devices can be as short as 3 ns, or more than an order of magnitude faster than dynamic RAMs, due largely to their lack of need for refresh and inherently faster operation of sense amplifiers since detection of data in a bistable circuit of a static RAM is far easier than detection of a minuscule amount of electrical charge in a capacitive memory cell of a dynamic RAM.

To fully exploit the potential speed of static RAMs, it is necessary to produce a wide voltage swing on a word line of the memory at high speed. The voltage swing must be large to provide sufficient voltage margins for various memory operations. Developing sufficiently large voltage swings at high speed is complicated by the capacitance of the word lines and the need to limit current within the device to minimize the power dissipation of the memory.

Since the practical length of word lines is limited by the capacitance which can be tolerated and the number of memory cells which can be coupled to a word line is limited by the physical size of the memory cells and the practical word line length, many word line drivers are required for memories of even modest size. As more memory cells are integrated on a single chip, it becomes more critically necessary to simplify the decoder word line driver circuits to allow more word line decoder/driver circuits to be placed on a chip and to further limit the stand-by current thereof.

In this regard, it should be noted that to obtain high switching speed, consistent with low stand-by current, it is often necessary to provide two stage decoders to obtain sufficiently large voltage swings to provide adequate base drive current for the word line driver transistors. Large voltage swings are needed in order to achieve sufficiently high currents through the word line driver transistors for the capacitive load presented by the word lines. This requirement also has prevented the reduction in the element count of the word line driver circuits. Further, the degree of speed increase possible by the use of two stage decoders is limited by the delay inherent in propagation of a signal through an increased number of stages.

So-called Darlington-connected transistor amplifiers are well known and are often employed in memory driver circuits because of their high speed, simplicity and integration compatibility with other components. In some word line drivers, Darlington circuits are used as direct drive for the word lines because of their high current carrying capability when relatively large values of power supply voltage are available. More recently, as disclosed in related co-pending application Ser. No. 07/651,680 by Joseph Y. Wong, entitled HIGH-SPEED, LOW-POWER PNP-LOADED WORD LINE DECODER/DRIVER CIRCUIT, assigned to the assignee of the present invention and hereby incorporated by reference, a Darlington circuit is used as the first stage of the decoder/driver, while a half current switch is used as the second stage to provide a full word line voltage swing.

However, unless operated at saturation or cut-off, Darlington-connected amplifiers have a high power dissipation which is undesirable in an integrated circuit having large number of such devices. It is also undesirable for saturation to occur in a high speed device since saturation increases parasitic capacitances and degrades switching speed. Therefore, the use of Darlington circuits in memory devices has usually been used to provide additional pull-up speed or additional current capacity only for an extremely short period of time at the beginning of a select period such as in the circuit of FIG. 1 which will be discussed in detail below.

SUMMARY OF THE INVENTION

It is therefore an object of the present invention to provide a word line driver circuit using a Darlington-connected circuit to increase the speed of operation thereof and wherein the Darlington-connected circuit directly supplies a portion of the word line driving current.

It is another object of the present invention to provide a word line decoder/driver circuit in which the element count is reduced consistent with increased speed of operation, improved voltage margins and reduced power requirements.

It is a further object of the present invention to provide a word line driver circuit in which improved performance can be realized at reduced power supply voltages.

It is yet another object of the invention to prove a word line decoder circuit in which high performance and switching speed can be achieved with a single stage decoder.

In order to satisfy the above and other objects of the invention, a word line driver circuit for a memory means is provided having a Darlington circuit connected in parallel with said at least one word line driver transistor; an input from a decoder circuit to said Darlington circuit being provided through a bootstrap capacitor.

In accordance with another aspect of the invention, a method is provided for driving a word line of a memory means having a parallel connection of at least one word line driver transistor and a Darlington circuit having an input signal provided through a bootstrap capacitor, including a step of providing an increased amount of charge on said bootstrap capacitor during a deselect period of said Darlington circuit.

In accordance with a further aspect of the invention, a word line decoder/driver circuit for a memory device is provided including a half current switch which includes an adjustable clamp for clamping a down-level voltage of a drain line of the memory device.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
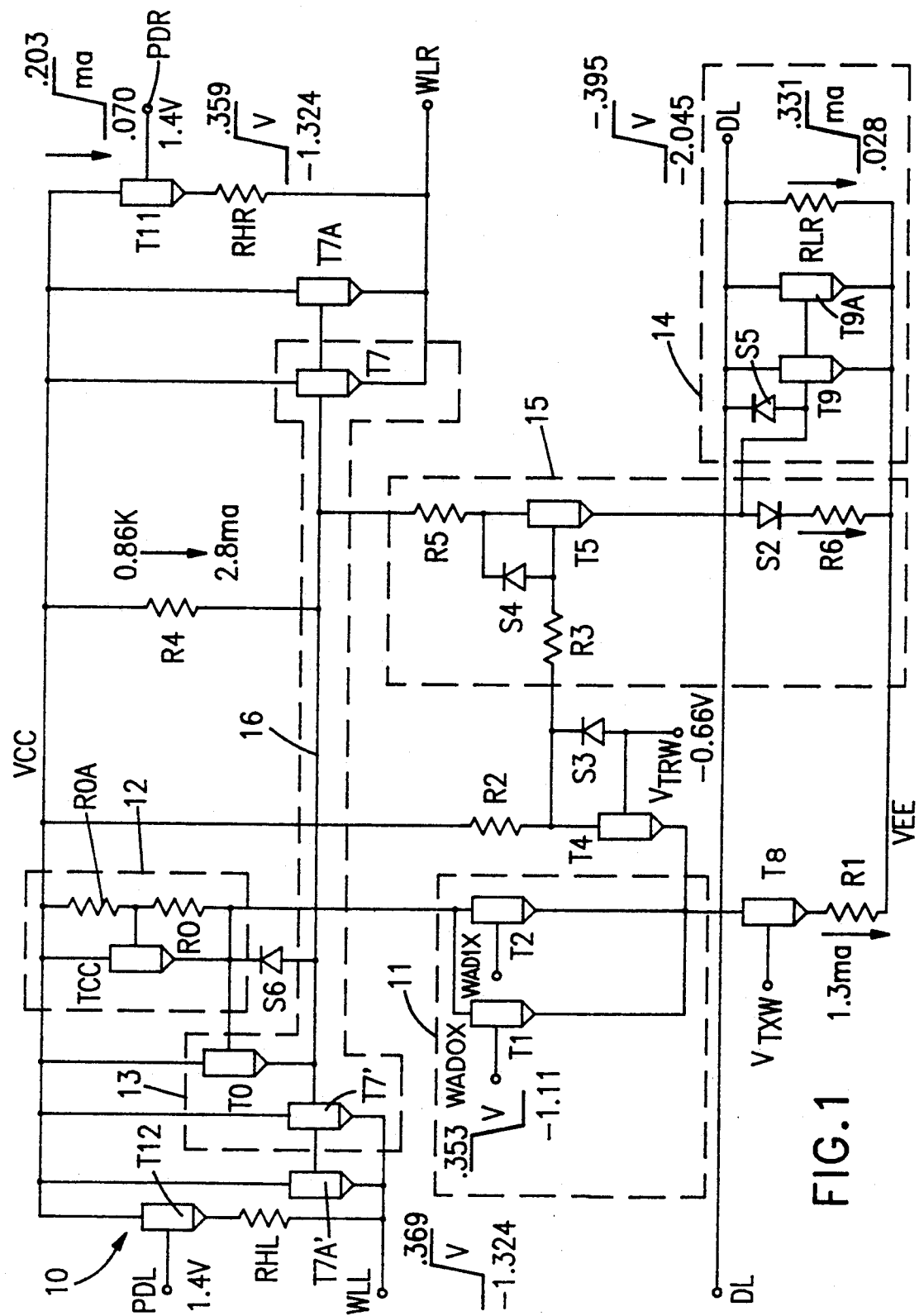
FIG. 1 is a schematic diagram of a type of decoder/driver circuit over which the present invention is an improvement.

Referring now to the drawings, and more particularly to FIG. 1, there is shown a circuit of a related type of decoder/driver circuit using a Darlington-connected circuit over which the present invention provides an improvement. A number of features of this circuit are conventional and unrelated to the function of the present invention and a detailed explanation of the entire circuit is unnecessary to an understanding of the invention. Generally, however, the functional parts of the decoder/driver 10 of FIG. 1 include a decoder section 11 comprising a plurality of parallel connected decoder transistors T1, T2. As is the general practice in the art, the driver remains deselected while any one or combination of the decoder transistors is conductive. To retain the highest possible switching speed, saturation of the decoder transistors is avoided by a down level clamp 12 formed by transistor TCC in combination with resistors R0A and R0. As is also common in the art, the decoder section 11 is connected in parallel with another current path including R2 and transistor T4, controlled by a reference voltage $V_{TRW}$. Since a constant current is drawn through the current source T8, R1, any change in the current through the decoder transistors will be reflected in a compensating current being drawn through R2, T4. The voltage drop across R2 therefore increases when the driver is selected (e.g. all decoder transistors are turned off), thus lowering the voltage applied to the base of transistor T5, in a half current switch 15, which in turn provides an input to the drain line driver 14.

Darlington circuit 13 is connected to provide increased word line current drive through word line driver transistors T7 and T7' in parallel with word line driver transistors T7A and T7A'. Transistor T0 of the Darlington circuit provides increased pull-up speed of node 16 and increased base current for the word line driver transistors. As is conventional in the art to minimize the length and capacitance of the word lines, the driver circuit is interposed in the center of the word line which is divided thereby into left and right halves. Transistors PDL and PDR, in combination with resistors RHL and RHR provide standby power to the memory cells in a conventional manner. Resistor R4 provides base current to the word line driver transistors. Drain line driver 14 provides appropriate voltage swings on the drain line DL for proper control of the memory cell functions under control of a half current switch circuit 15 which is also responsive to the decoder transistors as described above. During deselect periods, drain line clamping is provided by means of Diode S5.

In the circuit of FIG. 1, it is readily seen that the function of the Darlington circuit is to parallel the base current resistor R4 to provide additional base current to the word line driver transistors during turn-on. When the Darlington circuit is made conductive by the loss of pull down current through resistors R0A and R0 due to the turn-off of the decoder transistors upon selection, node 16 is rapidly pulled up to a voltage near $V_{cc}$. The Darlington circuit, itself, turns off when the voltage at node 16 reaches a value within about one $V_{be}$ below $V_{cc}$ and conduction of the word line driver transistors is sustained through R4. Rapid turn-off of the word line driver transistors is accomplished by discharging the node 16 through Schottky diode S6 and transistor T5 when one or more of the decoder transistors again becomes conductive.

At the same time the Darlington circuit is providing rapid pull-up of node 16, half current switch 15 is turned off so that current is not drawn from node 16. This allows for maximum voltage swing of node 16 and maximum current to be provided to the bases of the word line driver transistors T7, T7A, T7' and T7A'. Therefore, half current switch 15 functions as a second stage of the decoder circuit and allows completion of the pull-up of node 16 by the Darlington circuit which functions as a first stage of the decoder.

It should be noted that if the Darlington circuit was not used in the driver circuit, the common collector connection of the decoder transistors would be connected directly to node 16 and the circuit would operate in the same manner but very much more slowly. The use of the Darlington circuit and the avoidance of the direct connection of node 16 to the decoder transistors also allows R4 to be reduced relative to the circumstance without the Darlington circuit where R4 would be required to provide sufficient IR drop through R0 and R0A to establish the standby current of the decoder transistors. Reduction of the value of R4 also permits higher base current to be provided to the word line driver transistors.

Figure 2:
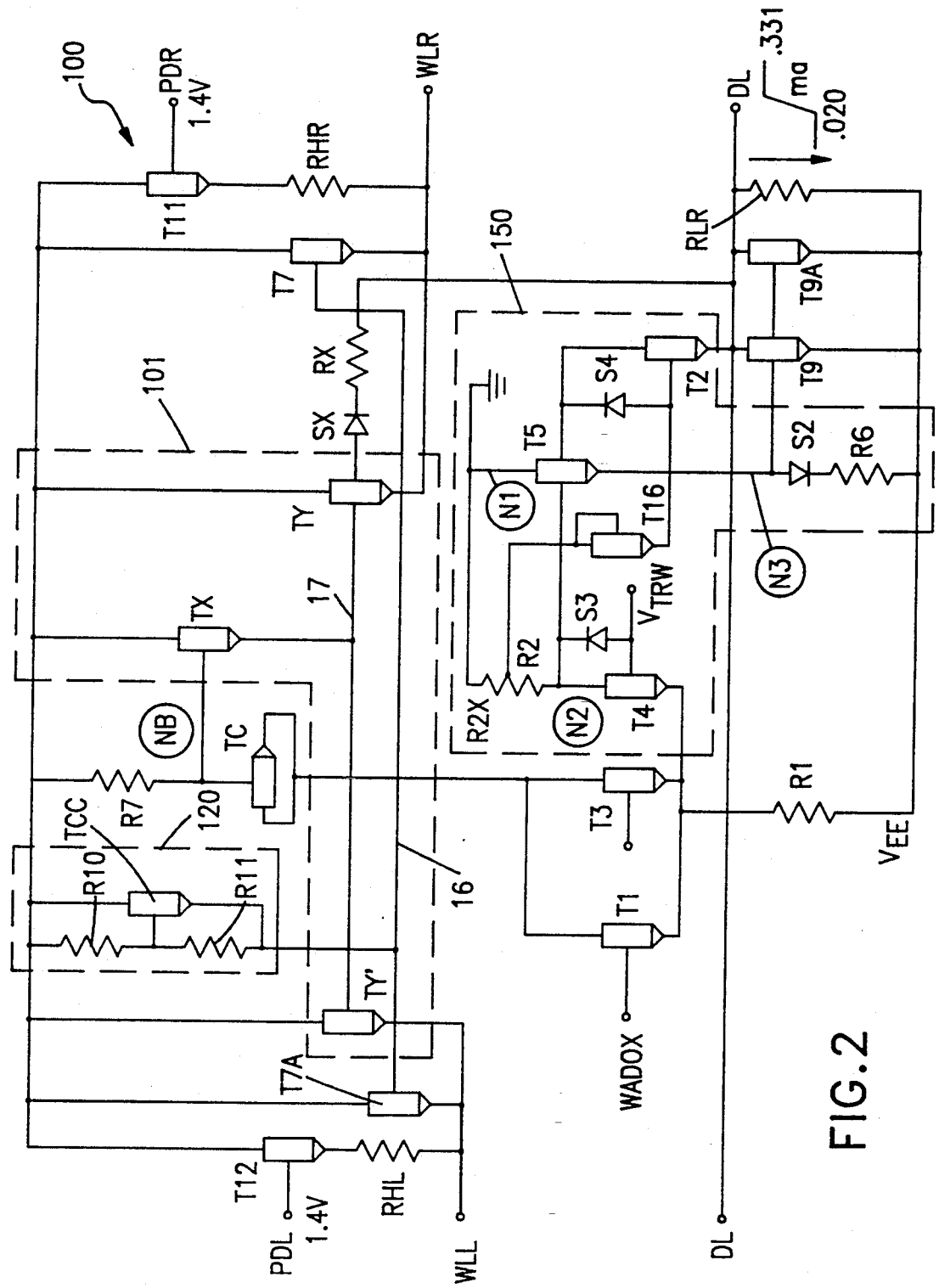
FIG. 2 is a schematic diagram of a preferred embodiment of the present invention.

In contrast to the circuit of FIG. 1, the circuit 100 according to the invention, as shown in FIG. 2, includes a Darlington-connected circuit but having the common collector node of the decoder transistors connected to node 16 as a single stage decoder. Thus, node 16 forms a node for coupling an input signal to the Darlington circuit as well as the input to the word line driver transistors T7 and T7A. Resistors R10 and R11 of down level clamp circuit 120 are used to provide base current to the word line driver transistors and R4 of FIG. 1 is not necessary. To obtain fast performance of the overall word line decoder/driver circuit according to the invention, the Darlington circuit parallels the word line driver transistors at transistors Ty and Ty' and supplies current directly to the word lines to cause a rapid and wide voltage swing. Note that the collector and emitter connections of the transistors Ty, Ty' is the same as in FIG. 1. However, according to the invention, an additional node 17 is formed as an input to transistors Ty, Ty' of the speed-up Darlington circuit 101. The input to the entire Darlington circuit 101 is bootstrapped above node 16 by a capacitance preferably formed by a transistor Tc connected to form a diffusion capacitance.

The effect of this connection of the Darlington circuit is enhanced in several ways in accordance with the invention by the formation of a diffusion capacitance Tc. The diffusion capacitance is preferably formed to have a capacitance of approximately 30 pF corresponding to a diffusion current of about 70 $\mu A$ (the capacitance varies with the diffusion current) which establishes a time constant of about 300 nsec in combination with the pull-up resistor R9 of FIG. 2 (resistors R10 and R11 of FIG. 6). The capacitance of Tc is variable with the current which is passed therethrough. When the decoder transistors become non-conductive, and the voltage at node 16 begins to rise, the Darlington circuit is bootstrapped, at node $N_B$ to a voltage above $V_{cc}$, driving the Darlington circuit upward quickly and immediately supplying substantial current to the word lines through Ty and Ty'. In contrast, if node NB is not bootstrapped, the voltage of nodes WLL and WLR can be driven no higher than about 2 $V_{BE}$ below $V_{CC}$, limiting the response of transistors T7 and T7A. Since this action occurs, the otherwise slow response of the word line driver transistors T7 and T7A becomes substantially irrelevant to the speed of operation of the entire word line driver circuit. In fact, because of the time constant of diffusion capacitance Tc, which can be, and preferably is, well in excess of the rise time of the word line driver, it is possible to complete a memory access operation cycle supported solely by the selection provided by the Darlington circuit and before substantial conduction by the word line driver transistors is established. Therefore, the word line driver transistors only supplement the pull up of the word lines by the Darlington circuit while the Darlington circuit is held on by the bootstrap capacitor. In fact, the only reason for retaining the word line driver transistors T7 and T7A is for a prolonged word line selection condition. When the selection is constant for a period in excess of the time constant of Tc, the word line drive is sustained through the word line driver transistors. However, it is expected that in normal operation, the operation controlled by word line selection will have been long since completed. Typically, under conditions of sustained selection, the memory operation will be controlled by signals on the bit lines of the memory which are typically much faster than the word lines and speed-up is generally not necessary. However, if desired, the principles of the invention could be applied to the bit lines, as well.

It should also be noted that the Darlington circuit output transistors Ty and Ty' parallel the word line driver transistors T7 and T7A and further parallel transistors need not be provided.

Figure 3:
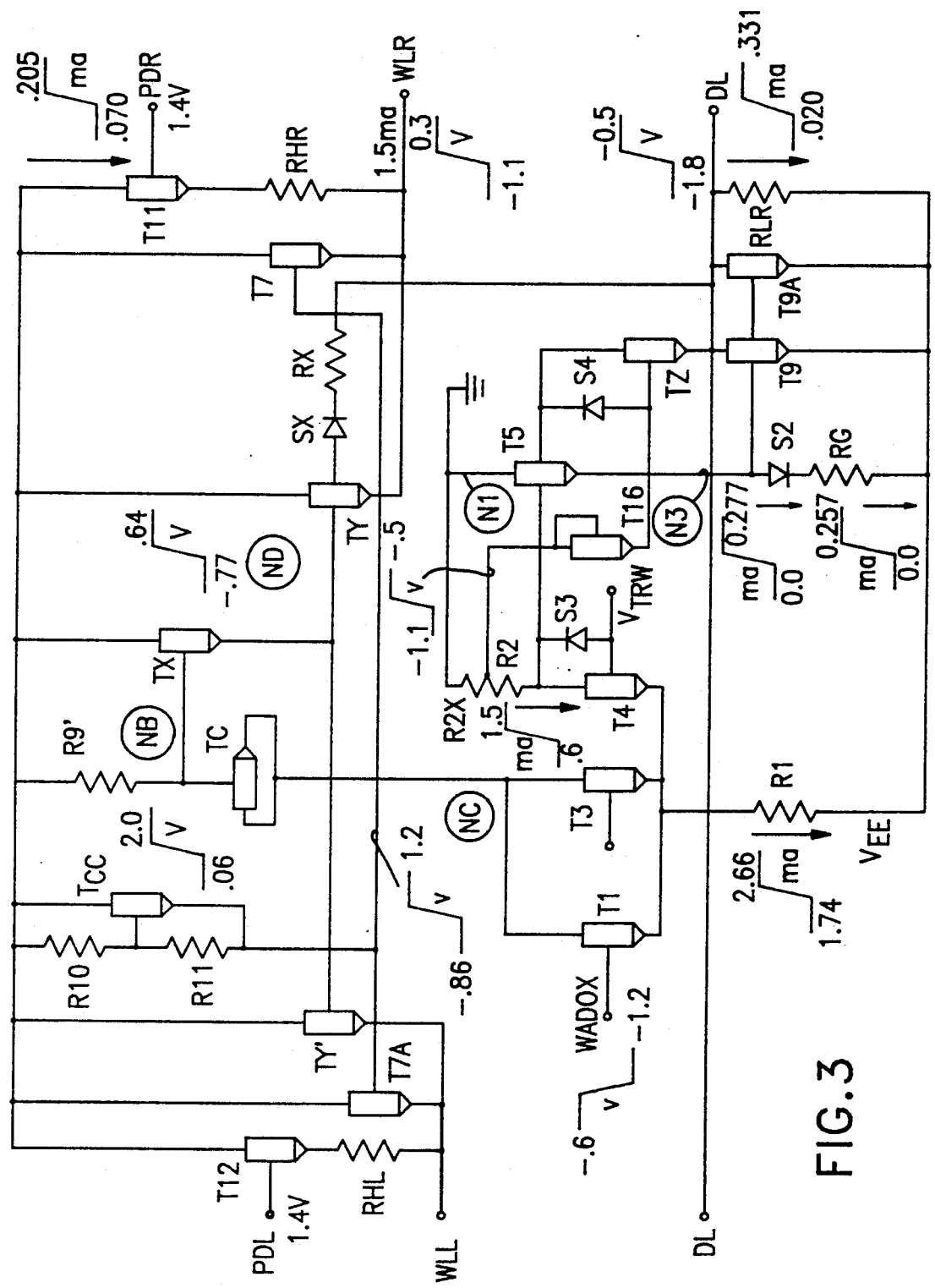
FIG. 3 is a further schematic of the present invention, according to FIG. 2, showing operational parameters thereof.

Referring now to FIG. 3, the schematic diagram of FIG. 2 is repeated with the voltage values at a selection transition being additionally illustrated. It will be observed from FIG. 3 and appreciated by those skilled in the art that the voltage swings are greater than those common in the prior art. With regard to the voltages applied to the memory cells, it will be appreciated that the voltages are advantageously more negative than is customary.

To prevent saturation of input transistors T1 or T3, current source transistor T8 and R1 of FIG. 1 are replaced by the single resistor R1 and the input voltage levels are adjusted downwardly so that node 16 can be switched down more than 2 V from Vcc. This results in a slight performance penalty of less than 50 psec, attributable to R1. However, the circuit is simplified by the avoidance of a current source T8 of FIG. 1 and the performance penalty is small compared to the overall performance gain.

The lowered voltage is provided simply by alteration of the values of voltage divider resistors in the reference voltage generator for $V_{TRW}$ and the word address receiver latch. These circuits are common memory components which are well-known and understood in the art. Different forms of these circuits may also be used. Since the invention does not rely on such modified voltages for operability but they are provided only as an operational enhancement, suitable modifications of these circuits, typically by alteration of resistor values in voltage dividers within these circuits, in whatever form these circuits exist for a particular memory design, will be evident to those skilled in the art from the voltages shown in FIG. 3.

Returning again briefly to FIG. 2, and comparing it to FIG. 1, it will be noted that circuit 150 in FIGS. 2 is modified from circuit 15 of FIG. 1. It will be recalled that, in the circuit of FIG. 1, the Darlington circuit was used to provide rapid pull-up of node 16 in order to turn on the word line driver transistors T7, T7', T7A and T7A'. Under such operational circumstances, it is desirable to use circuit 15 to provide synchronization of drive of the word lines and the Drain line DL. Circuit 15, in accordance with a reference voltage provided to transistor T4, also limits current to prevent saturation of the driver transistors T9 and T9A.

In the preferred embodiment of the invention, circuit 150 is biased to ground in order to reduce power consumption. The switching speed is made comparable to the word line drive of the Darlington circuit by the division of R2 into R2 and R2X to form a voltage divider and the addition of transistor $T_z$ to provide feedback to transistor T5. The R2, R2X voltage divider also allows adjustment of the clamp voltage. Note also that this configuration allows R3 to be omitted, since the bias for transistor $T_z$ is provided by the voltage divider R2, R2X through a level shifter such as a Schottky Barrier diode or, preferably, common base connected transistor T16. Since node N3 is 1 $V_{BE}$ below N2, DL is 2 $V_{BE}$ below N1. $V_{CE}$ for T9 and T9A is thus maintained by the voltage drop across R2 due to the current therethrough. The current limiting function of T5 is retained to prevent saturation of T9 and T9A. S4 is provided for the purpose of discharging the $T_z$ base node when the circuit is selected. This clamping circuitry for the drain line DL is preferred over the Schottky barrier diode (SBD) clamp of FIG. 1, where the drain line DL is clamped by S5 so that the collector-emitter voltage of T9 and T9A is maintained at $V_{be}-V_{SBD}$. However, $V_{be}-V_{SBD}$ is not adjustable and decreases to zero as temperature is increased. According to the invention, the connection of $T_z$ also provides temperature stabilization since temperature-related changes in T9, T9A will be compensated by feedback through $T_z$ to T5 by conducting current away from the half current switch portion of circuit 150. Additionally, feedback through $T_z$ provides increased speed of pull down of the drain line and forms an adjustable down level clamp when the circuit is deselected.

Compared with the circuit of FIG. 1, it should also be noted that Schottky diode Sx and resistor Rx, in the circuit of FIG. 2 are used in the preferred form of the invention. Resistor Rx functions as a passive pull-down resistor and the diode Sx protects transistor Ty from backward current from the drain line.

Figure 4:
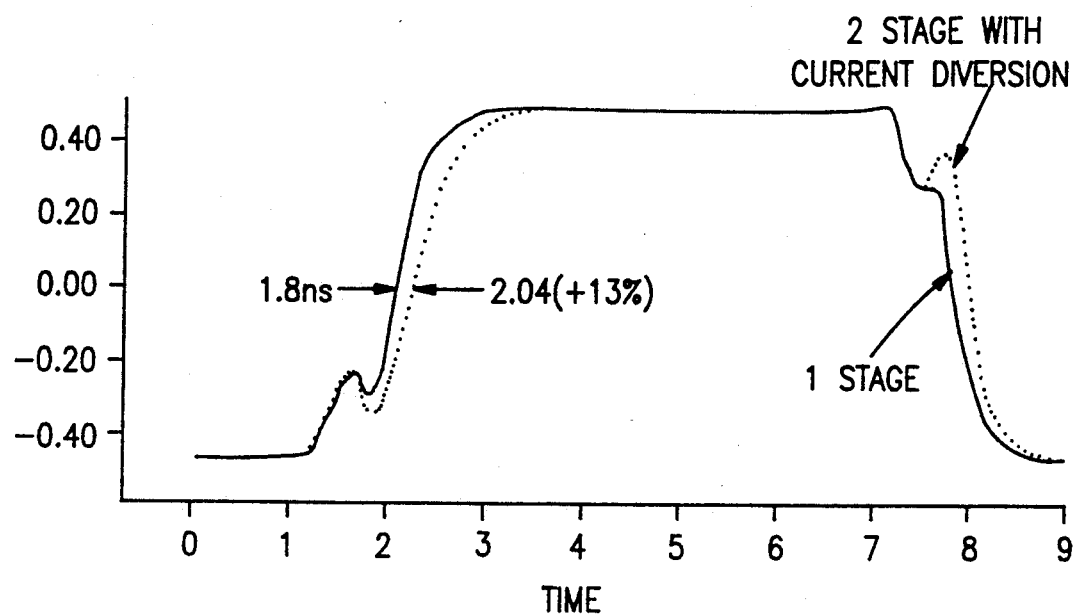
FIG. 4 is a graphical representation of a comparison of the performance of the invention between embodiments of the invention using one stage and two stage decoders.

Referring now to FIG. 4, the simulated performance of the circuit according to the invention and having a one-stage decoder is compared to a comparable circuit having a two-stage decoder, such as that of FIG. 1. Looking at the mid point of the voltage swing of the off chip driver (so-called because the simulation is of lumped performance from input pad to output pad), it is seen that this point is reached by the circuit of the invention after only 1.8 nsec from the address change, compared to 2.04 nsec for the chip with the two-stage decoder circuit. Therefore, the invention provides an 13% improvement in chip performance attributable solely to the use of a single stage decoder.

Figure 5:
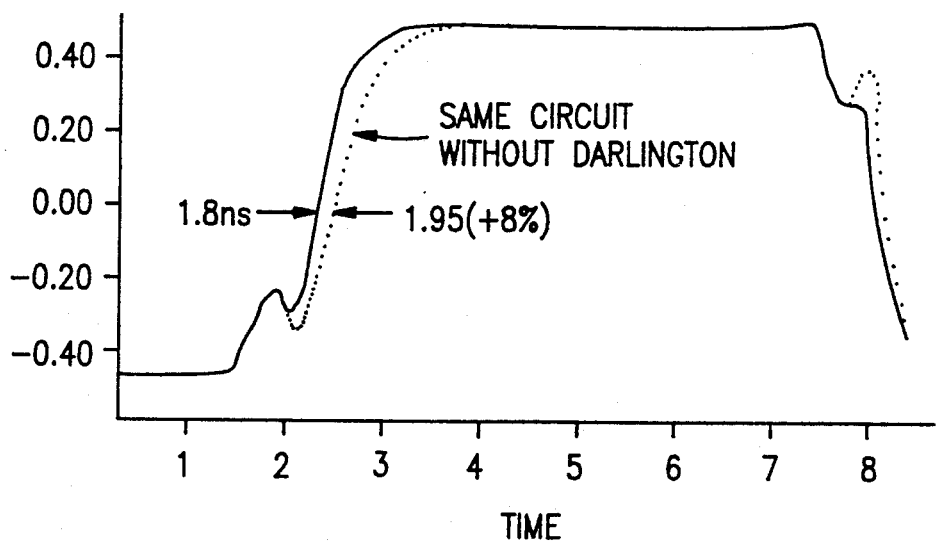
FIG. 5 is a graphical representation of a comparison of the invention with a comparable circuit without the Darlington circuit of the present invention.

Referring now to FIG. 5, a comparison of the performance of the circuit of the invention with the identical circuit but without the speed-up Darlington circuit 101 (specifically, with reference to FIG. 2, $T_c$, R9, Tx, Ty, Ty', Rx and Sx are all removed for purposes of comparison) shows an improved slew rate and an increase in switching speed of 8% attributable to the inclusion of circuit 101.

According to the invention, therefore, power is saved by using a single stage decoder circuit and using ground as a supply on one side of the current switch of which the decoder is formed. A reduction in power consumption of 55% is achieved while realizing an overall performance gain of 13%.

In view of the above, it is seen that an improved word line decoder/driver circuit has been provided by the invention which has a reduced element count in the circuit, increased speed of operation, reduced power requirements and in which a single-stage decoder can be used. Improved operating voltage margins are also provided by the invention by directly driving the word lines with the Darlington circuit in parallel with the word line driver transistors during a period when the input of the Darlington circuit is bootstrapped above Vcc.

Figure 6:
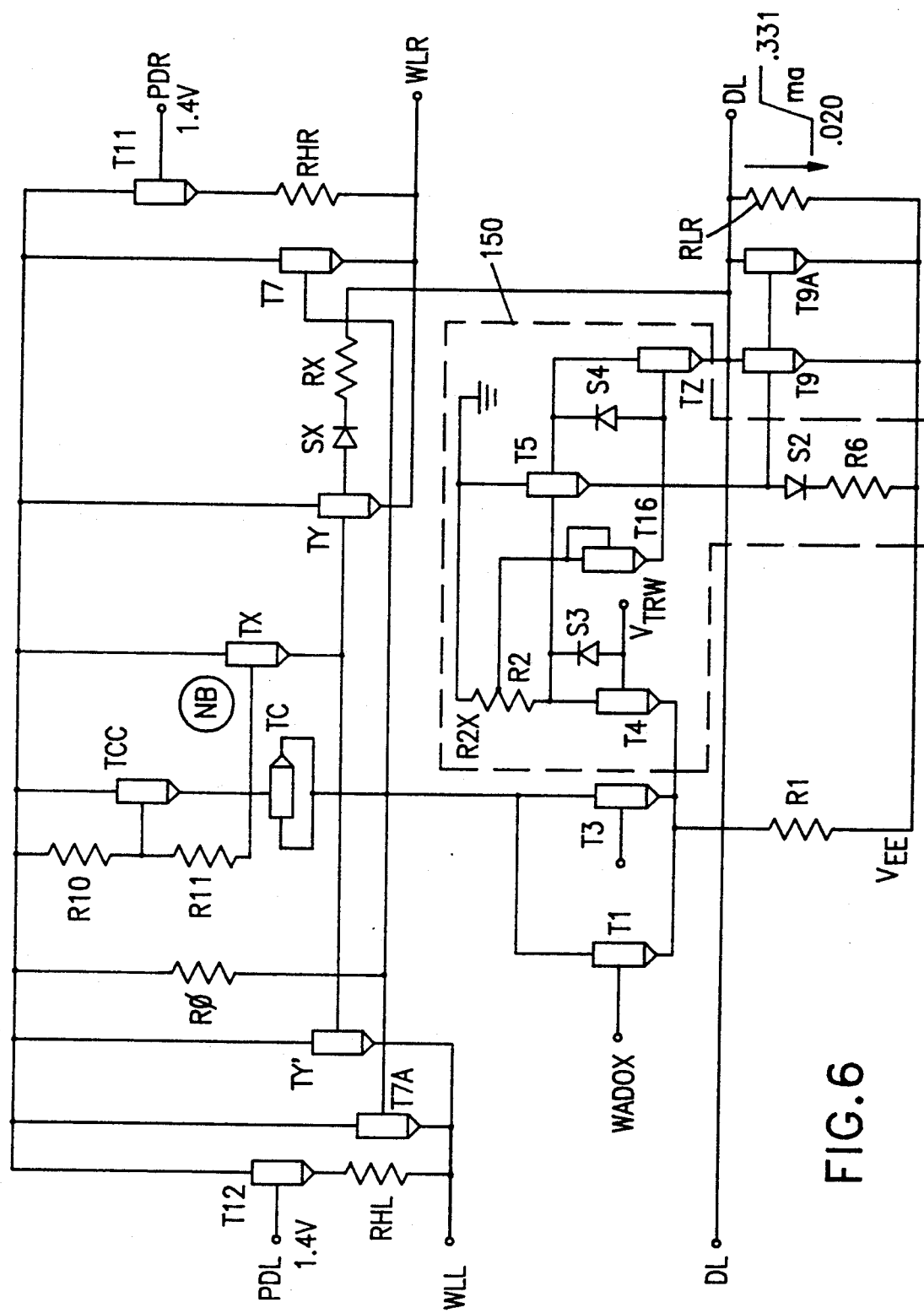
FIG. 6 is a schematic diagram of a variation of the invention shown in FIG. 2.

A variation of the invention is shown in FIG. 6 in which the bootstrap capacitor $T_c$ is part of the down level clamp for node 16. In this case, the clamp level is less precise (since clamping is now provided through $T_c$) but the clamp current is utilized to provide the diffusion capacitance, allowing the omission of R9.

It should also be noted that both of the embodiments of FIG. 2 and FIG. 6 are configured to operate with a reduced power supply voltage of 3.6 volts which considerably simplifies power supply design and reduces the cost of the systems in which the system is employed. However, the principles of the invention may be used to improve performance of decoder/driver circuits designed for and/or used with other power supply voltages.

While the invention has been described in terms of a single preferred embodiment and a varition thereof, those skilled in the art will recognize that the invention can be practiced with modification within the spirit and scope of the appended claims.

Having thus described my invention, what I claim as new and desire to secure by Letters Patent is as follows:

1. A word line driver circuit for a memory means, said word line driver circuit having at least one word line driver transistor including
    a Darlington circuit connected in parallel with said at least one word line driver transistor; an input to said Darlington circuit being connected to an input of said word line driver transistor through a bootstrap capacitor.

2. A circuit as recited in claim 1, wherein said bootstrap capacitor is provided with a conductance means; the combination of said capacitor and said conductance forming a time constant producing means.

3. A circuit as recited in claim 2, wherein said time constant producing means includes a diffusion capacitance.

4. A circuit as recited in claim 3, wherein a time constant produced by said time constant producing means is in excess of an access cycle time of said memory means.

5. A word line driver circuit for a memory means, said word line driver circuit having at least one word line driver transistor including
    a Darlington circuit connected in parallel with said at least one word line driver transistor; an input to said Darlington circuit being connected to an input of said word line driver transistor through a bootstrap capacitor having a capacitance which is variable with a conductance through said bootstrap capacitor.

6. A circuit as recited in claim 5, wherein said bootstrap capacitor is provided with a conductance means; the combination of said capacitor and said conductance forming a time constant producing means.

7. A circuit as recited in claim 6, wherein said time constant producing means is a diffusion capacitance.

8. A circuit as recited in claim 7, wherein a time constant produced by said time constant producing means is in excess of an access cycle time of said memory means.

9. A circuit as recited in claim 5, wherein said capacitance is a diffusion capacitance.

10. A word line decoder/driver circuit for a memory device including a half current switch, said half current switch including an adjustable clamp means for clamping a down-level voltage of a drain line of said memory device.

11. A circuit as recited in claim 10, wherein said adjustable clamp means includes means for providing temperature compensation of said half current switch.

12. A circuit as recited in claim 11, wherein said half current switch includes a transistor and wherein said means for providing temperature compensation of said half current switch comprises a feedback circuit connected to conduct current away from a base of said transistor of said half current switch.

* * * * *